(12) United States Patent
Kim

(10) Patent No.: US 10,600,907 B2
(45) Date of Patent: Mar. 24, 2020

(54) HIGH VOLTAGE SEMICONDUCTOR DEVICE

(71) Applicant: MagnaChip Semiconductor, Ltd., Cheongju-si (KR)

(72) Inventor: Young Bae Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/571,291

(22) Filed: Sep. 16, 2019

(65) Prior Publication Data

US 2020/0013889 A1   Jan. 9, 2020

Related U.S. Application Data

(63) Continuation of application No. 15/860,026, filed on Jan. 2, 2018, now Pat. No. 10,461,181.

(30) Foreign Application Priority Data

May 31, 2017 (KR) .................. 10-2017-0067955

(51) Int. Cl.

| H01L 29/78 | (2006.01) |
|---|---|
| H01L 29/06 | (2006.01) |
| H01L 23/522 | (2006.01) |
| H01L 29/423 | (2006.01) |
| H01L 21/761 | (2006.01) |

(Continued)

(52) U.S. Cl.
CPC ........ *H01L 29/7816* (2013.01); *H01L 21/761* (2013.01); *H01L 23/522* (2013.01); *H01L 29/0615* (2013.01); *H01L 29/0646* (2013.01); *H01L 29/42356* (2013.01); *H01L 29/7835* (2013.01); *H01L 21/823481* (2013.01); *H01L 27/088* (2013.01); *H01L 27/0922* (2013.01);
(Continued)

(58) Field of Classification Search
CPC ............. H01L 29/7816; H01L 29/7823; H01L 29/0646
USPC ...................................................... 257/335
See application file for complete search history.

(56) References Cited

U.S. PATENT DOCUMENTS

| RE33,209 E | * | 5/1990 | Plummer | .............. | H01L 27/088 257/124 |
| 5,583,365 A | * | 12/1996 | Villa | .................... | H01L 29/1083 257/343 |

(Continued)

*Primary Examiner* — Victoria K. Hall
(74) *Attorney, Agent, or Firm* — NSIP Law

(57) ABSTRACT

A high voltage semiconductor device includes a semiconductor substrate, a first region, a second region, and an interconnection region. The first region includes an N-type first semiconductor region, an N-type drain region formed in the N-type first semiconductor region, a P-type first body region, an N-type source region formed in the P-type first body region, and a gate electrode formed between the N-type source region and the N-type drain region. The second region includes an N-type second semiconductor region, and a P-type second body region formed in the N-type second semiconductor region. The interconnection region is disposed between the first region and the second region, and includes a first insulation layer formed between the N-type first semiconductor region and the N-type second semiconductor region, a metal interconnection formed on the first insulation layer, and an isolation region formed in the substrate and disposed below the first insulation layer.

15 Claims, 11 Drawing Sheets

(51) Int. Cl.
　　　H01L 21/8234　　　(2006.01)
　　　H01L 27/088　　　(2006.01)
　　　H01L 29/10　　　(2006.01)
　　　H01L 27/092　　　(2006.01)

(52) U.S. Cl.
　　　CPC ........ *H01L 29/063* (2013.01); *H01L 29/1083* (2013.01); *H01L 29/42368* (2013.01)

(56) References Cited

U.S. PATENT DOCUMENTS

| | | | | |
|---|---|---|---|---|
| 5,801,420 | A * | 9/1998 | Fujishima | H01L 29/0634 257/133 |
| 5,894,156 | A * | 4/1999 | Terashima | H01L 27/0629 257/374 |
| 6,225,673 | B1 | 5/2001 | Pendharkar | H01L 21/761 257/502 |
| 6,600,206 | B2 * | 7/2003 | Jeon | H01L 29/0696 257/500 |
| 7,294,901 | B2 * | 11/2007 | Shimizu | H01L 21/763 257/492 |
| 7,812,402 | B2 * | 10/2010 | Hatade | H01L 21/823814 257/168 |
| 8,569,836 | B2 * | 10/2013 | Lee | H01L 27/0277 257/337 |
| 8,618,627 | B2 * | 12/2013 | Kim | H01L 29/7393 257/500 |
| 8,878,236 | B1 * | 11/2014 | Veeramma | H01L 29/87 257/107 |
| 8,957,475 | B2 * | 2/2015 | Moon | H01L 29/66681 257/335 |
| 9,171,916 | B1 | 10/2015 | Snyder | H01L 29/402 |
| 9,520,471 | B1 | 12/2016 | Chan | H01L 29/42368 |
| 10,135,445 | B2 * | 11/2018 | Yamaji | H01L 21/76 |
| 10,290,705 | B2 * | 5/2019 | Huang | H01L 21/76229 |
| 10,424,647 | B2 * | 9/2019 | Cai | H01L 21/26586 |
| 10,424,655 | B2 * | 9/2019 | Li | H01L 21/76224 |
| 10,461,181 | B2 * | 10/2019 | Kim | H01L 29/7816 |
| 10,490,456 | B2 * | 11/2019 | Kim | H01L 29/0634 |
| 10,510,834 | B2 * | 12/2019 | Siddiqui | H01L 29/7817 |
| 2001/0050394 | A1 * | 12/2001 | Onishi | H01L 29/0634 257/343 |
| 2002/0017683 | A1 * | 2/2002 | Jeon | H01L 21/761 257/339 |
| 2002/0050613 | A1 * | 5/2002 | Rumennik | H01L 29/0619 257/325 |
| 2002/0060341 | A1 * | 5/2002 | Terashima | H01L 29/0619 257/335 |
| 2003/0132450 | A1 * | 7/2003 | Minato | H01L 29/0619 257/110 |
| 2003/0168710 | A1 * | 9/2003 | Kim | H01L 21/761 257/500 |
| 2004/0033666 | A1 * | 2/2004 | Williams | H01L 21/26513 438/297 |
| 2004/0036115 | A1 * | 2/2004 | Disney | H01L 21/823418 257/342 |
| 2004/0232522 | A1 * | 11/2004 | Shimizu | H01L 21/763 257/548 |
| 2005/0218431 | A1 * | 10/2005 | Nair | H01L 29/0634 257/262 |
| 2005/0253218 | A1 * | 11/2005 | Jeon | H01L 27/0629 257/500 |
| 2006/0022265 | A1 * | 2/2006 | Yoshida | H01L 29/7816 257/335 |
| 2006/0071269 | A1 * | 4/2006 | Hebert | H01L 21/26513 257/335 |
| 2007/0013022 | A1 * | 1/2007 | Shimizu | H01L 21/84 257/500 |
| 2007/0085595 | A1 * | 4/2007 | Taki | H01L 29/7816 327/534 |
| 2008/0074165 | A1 * | 3/2008 | Jeon | H01L 27/0629 327/333 |
| 2008/0203519 | A1 * | 8/2008 | Min | H01L 21/761 257/501 |
| 2008/0251811 | A1 * | 10/2008 | Terashima | H01L 27/088 257/140 |
| 2009/0179270 | A1 * | 7/2009 | Chen | H01L 29/0653 257/355 |
| 2010/0176480 | A1 * | 7/2010 | Senda | H01L 21/84 257/501 |
| 2010/0314710 | A1 * | 12/2010 | Yamaji | H01L 24/05 257/501 |
| 2011/0127602 | A1 * | 6/2011 | Mallikarjunaswamy | H01L 21/823807 257/331 |
| 2011/0133269 | A1 * | 6/2011 | Yamaji | H01L 27/1203 257/328 |
| 2011/0316078 | A1 * | 12/2011 | Kim | H01L 29/7393 257/337 |
| 2012/0086052 | A1 * | 4/2012 | Chen | H01L 29/0607 257/288 |
| 2012/0104492 | A1 * | 5/2012 | Chu | H01L 29/0634 257/335 |
| 2012/0112240 | A1 * | 5/2012 | Takeda | H01L 29/0873 257/133 |
| 2012/0175673 | A1 * | 7/2012 | Lee | H01L 27/0277 257/140 |
| 2014/0049293 | A1 * | 2/2014 | Mallikarjunaswamy | H01L 21/8221 327/108 |
| 2014/0353749 | A1 * | 12/2014 | Hebert | H01L 29/7816 257/337 |
| 2015/0041894 | A1 * | 2/2015 | Hebert | H01L 29/7816 257/339 |
| 2015/0048449 | A1 * | 2/2015 | Jeon | H01L 29/7816 257/337 |
| 2015/0115342 | A1 * | 4/2015 | Kaya | H01L 29/7816 257/296 |
| 2015/0221720 | A1 * | 8/2015 | Mallikarjunaswamy | H01L 29/7835 257/495 |
| 2015/0243766 | A1 * | 8/2015 | Tu | H01L 29/66681 257/329 |
| 2015/0255595 | A1 * | 9/2015 | Hebert | H01L 29/66598 257/344 |
| 2015/0270390 | A1 * | 9/2015 | Kaya | H01L 29/0619 257/339 |
| 2016/0163583 | A1 * | 6/2016 | Liu | H01L 29/0692 257/401 |
| 2016/0260704 | A1 * | 9/2016 | Huo | H01L 27/0629 |
| 2017/0019093 | A1 * | 1/2017 | Kanda | H01L 29/0696 |
| 2017/0110447 | A1 * | 4/2017 | Naito | H01L 27/0255 |
| 2017/0291415 | A1 * | 10/2017 | Matsumoto | B41J 2/14 |
| 2017/0301668 | A1 * | 10/2017 | Kim | H01L 27/088 |

\* cited by examiner

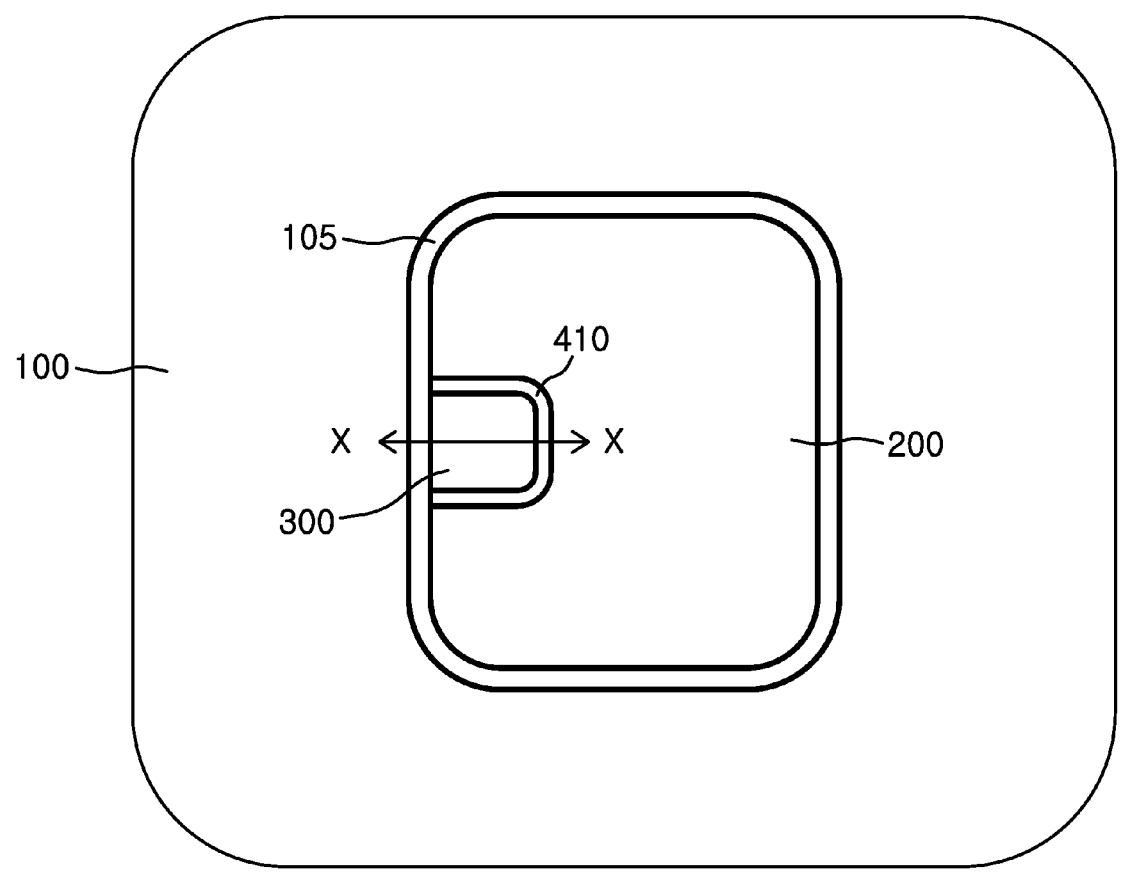

HIGH VOLTAGE SEMICONDUCTOR DEVICE

CROSS-REFERENCE TO RELATED APPLICATIONS

This application is a Continuation Application of U.S. patent application Ser. No. 15/860,026 filed on Jan. 2, 2018, now U.S. Pat. No. 10,461,181, issued Oct. 29, 2019, which claims the benefit under 35 U.S.C. 119(a) of Korean Patent Application No. 10-2017-0067955 filed on May 31, 2017 in the Korean Intellectual Property Office, the entire disclosures of which are incorporated herein by reference for all purposes.

BACKGROUND

1. Field

The present disclosure relates to a high voltage semiconductor device. The present disclosure also relates to a high voltage semiconductor device for preventing the current leakage between a low voltage region and a high voltage region both included in the high voltage semiconductor device and for restraining operations of a parasitic transistor which may easily occur in the high voltage region.

2. Description of Related Art

In general, a high voltage transistor of a Complementary Metal Oxide Semiconductor (CMOS) device is operated at a high voltage, and it is widely used for an operating circuit of semiconductor devices such as a non-volatile memory device or a volatile memory device. The high voltage transistor includes a gate insulating layer that is thick enough to have a breakdown voltage for high voltage.

A Laterally Diffused Metal-Oxide Semiconductor (LDMOS) transistor that is a power device for high voltage has some advantages such as fast switching speed, high input impedance, low power consumption, and compatibility with CMOS processing. The LDMOS transistor is widely used for various power devices such as a Display Driver Integrated Circuit, a power converter, a motor controller, or a power supply for automobiles. In regards to the power devices, specific on-resistance and breakdown voltage are important factors that have a major influence on the performance of devices.

In contrast, a low voltage transistor is a device that is operated at a low voltage, and is widely used for operating circuits of a semiconductor device such as a logic device. Since the low voltage transistor is operated at the comparatively lower voltage, the thickness of its gate insulating layer of low voltage transistor is thinner than that of a gate insulating layer of a high voltage transistor.

Typically, for the fabrication of non-volatile semiconductor devices that are well-known for a Display Driver Integrated Circuit or a flash memory, a low voltage transistor and a high voltage transistor both have to be formed in the same semiconductor substrate. The level of high voltage required for each semiconductor device is determined to be from 10V to tens of volts, whereas the level of low voltage has rapidly reduced for high performance and reduced chip size. For this reason, as high-density integration of semiconductor devices is implemented, the difference between a high voltage and a low voltage requirement becomes greater. As a result, it is becoming more difficult to form a low voltage transistor and a high voltage transistor in the same semiconductor substrate.

A high voltage semiconductor device with a voltage greater than or equal to 600V may be used for a motor driver or a Light-Emitting Diode lighting with a high voltage requirement. The high voltage semiconductor device is divided into a high voltage region and a low voltage region, and it may be necessary to form an isolation region between the high and low voltage regions. In particular, the high voltage region uses a well region having a low doping concentration, which may cause parasitic losses in the transistor resulting in design limitations and errors when the finished product operates.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a high voltage semiconductor device includes a semiconductor substrate that includes a first region and a second region and an interconnection region that connects the first region and the second region. The first region includes an N-type first semiconductor region formed on the semiconductor substrate, an N-type drain region formed in the N-type first semiconductor region, a P-type first body region formed on the semiconductor substrate, an N-type source region formed in the P-type first body region, and a gate electrode formed between the N-type source region and the N-type drain region. The second region includes an N-type second semiconductor region formed on the semiconductor substrate and a P-type second body region formed in the N-type second semiconductor region. The interconnection region includes a first insulation layer formed between the N-type first semiconductor region and the N-type second semiconductor region and is formed on the surface of semiconductor substrate, a metal interconnection formed on the first insulation layer, and an isolation region formed to be directly contacted to the first insulation layer.

The isolation region may include a P-type junction isolation region. The P-type junction isolation region may be formed to be conductive as the semiconductor substrate and be doped with a concentration higher than a doping concentration of the semiconductor substrate.

The P-type junction isolation region may have a concentration over 2 orders of magnitude greater than a concentration of the semiconductor substrate.

The high voltage semiconductor device may further include an N-type first buried doped layer formed between the N-type first semiconductor region and the semiconductor substrate and an N-type second buried doping layer formed between the N-type second semiconductor region and the semiconductor substrate.

The metal interconnection may electrically connect the N-type drain region and the P-type second body region.

The second region may further include a P-type first highly doped region and a P-type second highly doped region that are formed in the P-type second body region, a second insulation layer formed between the P-type first highly doped region and the P-type second highly doped region, an N-type third highly doped region formed in the N-type second semiconductor region, and a third insulation layer formed between the P-type second highly doped region and the N-type third highly doped region and is formed on the surface of semiconductor substrate.

The high voltage semiconductor device may further include, in the N-type second semiconductor region of the second region, an N-type second well region formed to be directly connected to the first insulation layer.

The metal interconnection may electrically connect the N-type drain region and the P-type first highly doped region.

The first region may further include a first deep trench formed to be close to the P-type first body region. The isolation region may further include a plurality of second deep trenches that extend from the first insulation layer to the semiconductor substrate.

The first deep trench may be connected to a plurality of second deep trenches.

Insides of the first deep trench and a plurality of second deep trenches may be filled with an oxide film.

The high voltage semiconductor device may further include a P-type well region that encompasses the first deep trench.

In another general aspect, a high voltage semiconductor device includes a first region, a second region, and an interconnection region. The first region includes a Laterally Diffused Metal-Oxide-Semiconductor (LDMOS) device. The LDMOS device includes an N-type high-concentration source region; a P-type high-concentration pick-up region, wherein the N-type high-concentration source region and the P-type high-concentration pick-up region are formed in a first P-type body region; a drain region; and a P-type buried doping layer formed below a bottom surface of an insulation layer. The second region includes a second body region; a P-type first highly doped region and a P-type second highly doped region, wherein the P-type first highly doped region and the P-type second highly doped region are formed in the second body region; a N-type third highly doped region; and a second buried doping region. The interconnection region connects the first region to the second region.

The first region may further include a first deep trench and the interconnection region may include a second deep trench.

A first deep trench and a second deep trench may surround the LDMOS device.

A P-type well region may encompass the first deep trench.

The second deep trench may include a plurality of deep trenches.

The deep trenches may be formed over a first epitaxial layer and a second epitaxial layer.

A metal interconnection may connect the first region and the second region.

Other features and aspects will be apparent from the following detailed description, the drawings, and the claims.

BRIEF DESCRIPTION OF THE DRAWINGS

FIG. 1A and FIG. 1B are top plan views of examples of a high voltage semiconductor device.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1B:
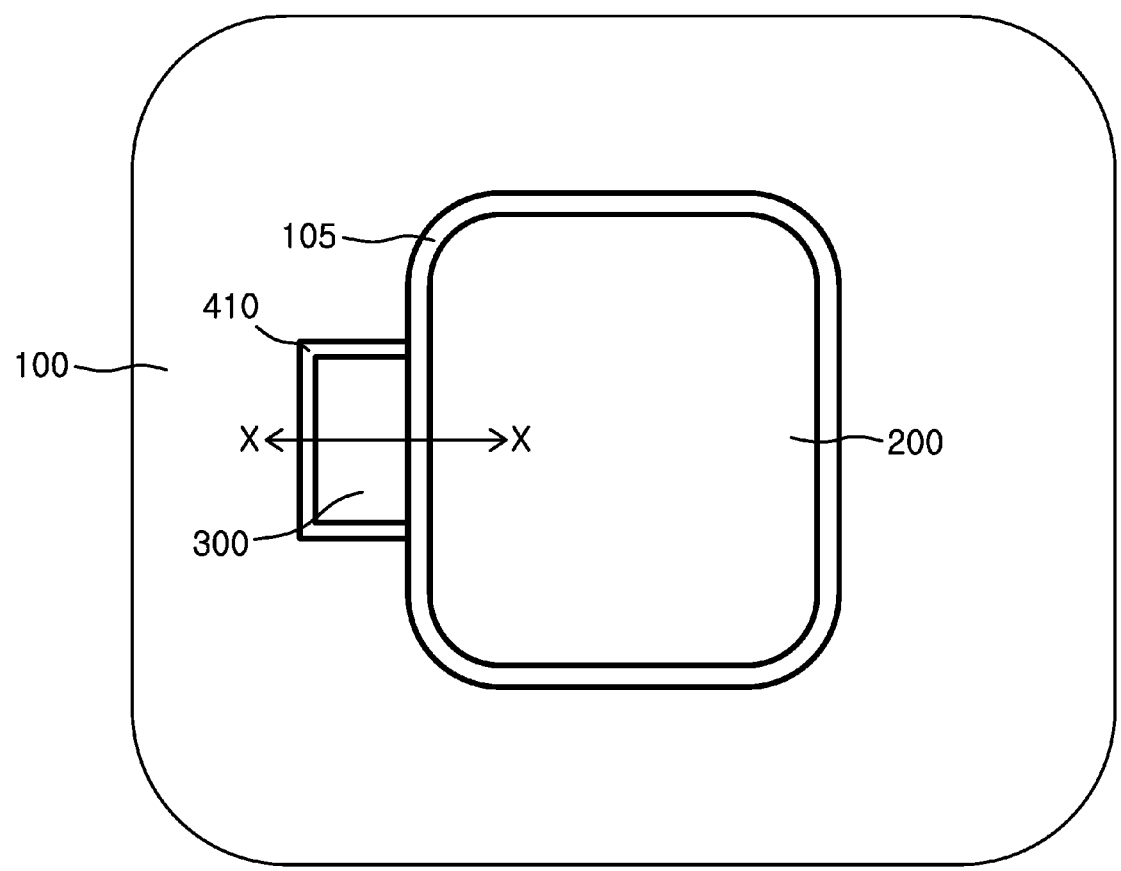

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Examples of the present disclosure may describe a high voltage semiconductor device that is capable of preventing a parasitic transistor from operating by using a highly doped layer between a substrate and an epitaxial layer.

Examples of the present disclosure may describe a high voltage semiconductor device that is capable of stably operating a low voltage region despite a high voltage region by adding a high-concentration well region between the high and low voltage regions.

Examples of the present disclosure are provided to introduce a high voltage semiconductor device that is capable of efficiently separating a high voltage region and a low voltage region each other by using an isolated structure in where a deep trench structure is located between the high and low voltage regions.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIGS. 1A and 1B are top plan views of examples of a high voltage semiconductor device.

As illustrated in FIGS. 1A and 1B, a high voltage semiconductor device includes a first region 100, a second region 200, a Laterally Diffused Metal-Oxide-Semiconductor (LDMOS) device 300, an N-type junction isolation region 105, and a P-type junction isolation region 410. The first region 100 refers to a region in which operations occur under a low voltage condition. The second region 200 refers to a region in which operations occur under a high voltage condition. The low voltage may refer to a voltage less than or equal to 20V, and the high voltage may refer to a voltage in a range of 200 to 1000V. Here, the LDMOS device 300 is surrounded with the N-type junction isolation region 105 and the P-type junction isolation region 410, and thus, the low voltage region (that is, the first region 100) and the high voltage region (that is, the second region 200) are distinguished from each other. FIG. 1A shows the case in which the LDMOS device 300 is included in the high voltage region (that is, the second region 200). FIG. 1B shows the case in which the LDMOS device 300 is included in the low voltage region (that is, the first region 100). Here, the LDMOS device 300 takes the role of transferring a signal of the first region 100 to the second region 200 and vice-versa. The LDMOS device 300 refers to a Laterally Diffused Metal-Oxide-Semiconductor device but instead of the LDMOS device 300, an Extended Drain Metal-Oxide-Semiconductor (EDMOS) device, a Double-diffused Metal-Oxide-Semiconductor (DMOS) device, or a high voltage device may be included. The LDMOS device 300 may take a role of a level shifter. The LDMOS device 300 is a structure which is capable of withstanding a relatively high voltage because a high voltage in the range of from about 200 to about 1000V may be applied to the drain region of the LDMOS device 300.

Hereinafter, FIGS. 2, 3A, and 3B, which are cross-sections made by cutting along the line X-X in FIG. 1A or 1B, are referred to describe detailed features of each component of the high voltage semiconductor device.

Figure 2:
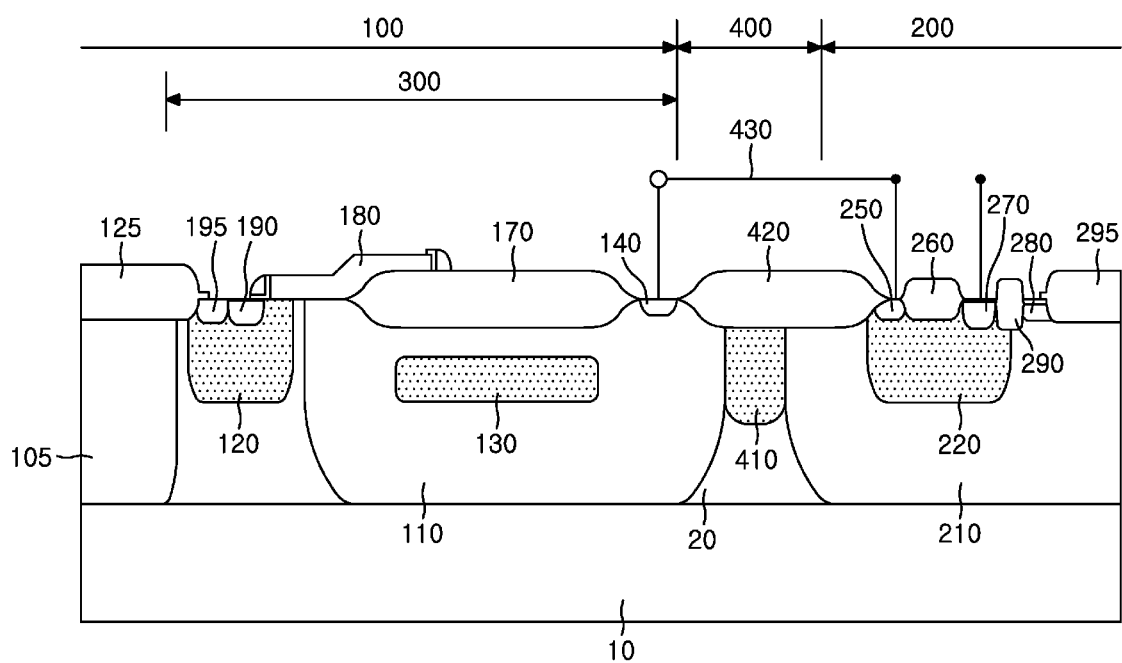
FIG. 2 is a cross-sectional view of an example of a high voltage semiconductor device.

FIG. 2 is a cross-sectional view of a high voltage semiconductor device according to an example.

As illustrated in FIG. 2, a high voltage semiconductor device includes a first region 100 in which operations occur under a low voltage condition and a second region 200 in which operations occur under a high voltage condition. The range of the low voltage may be less than or equal to 20V, and the range of the high voltage may be from about 200V to 1000V. The high voltage semiconductor device may be a semiconductor device in which a gap between a low voltage and a high voltage is very large. Here, the LDMOS device 300 is included in the first region 100. The LDMOS device 300 is structure capable of withstanding a relatively high voltage. In other words, a high voltage in the range of from about 200 to about 1000V may be applied to a drain region 140 of the LDMOS device 300. The LDMOS device 300 takes a role of transferring a signal of the first region 100 to the second region 200. There is an interconnection region 400, which makes an electrical connection between the first region 100 and the second region 200.

The first region 100 is formed in a P-type epitaxial layer 20 formed on a P-type substrate 10. Since the P-type epitaxial layer 20 has the same conductivity type as the P-type substrate 10, it is reasonable to consider them as one semiconductor substrate. The first region 100 includes the N-type junction isolation region 105. The N-type junction isolation region 105 is formed under an insulation layer 125 to separate the LDMOS device 300 from the first region 100. To simplify the process, the N-type junction isolation region 105 may be made under the same conditions where an N-type first semiconductor region 110 is made. Therefore, the depth of the N-type junction isolation region 105 is the same as the depth of the N-type first semiconductor region 110.

The LDMOS device 300 is formed in the P-type epitaxial layer 20 and transfers a signal of the first region 100 to the second region 200. Here, the LDMOS device 300 refers to a Laterally Diffused Metal-Oxide-Semiconductor device. Instead of the LDMOS device 300, an EDMOS device, a DMOS device, or a high voltage device may be used. The LDMOS device 300 may take a role of a level shifter.

The LDMOS device 300 includes an N-type high-concentration source region 190 and a P-type high-concentration pick-up region 195 both formed in a first P-type body region 120. The P-type high-concentration pick-up region 195 is a pick-up region with regard to the first P-type body region 120. Since the N-type high-concentration source region 190 and the P-type high-concentration pick-up region 195 are contacted to each other, a bias voltage is simultaneously applied to both regions. A ground voltage may be applied to both regions at the same time. The LDMOS device 300 includes a drain region 140 with high concentration, which is formed in the N-type first semiconductor region 110.

The N-type first semiconductor region 110 is regarded as a drift region. In this case, the N-type first semiconductor region 110 is formed after an N-type dopant is ion-injected in the P-type epitaxial layer 20 and the dopant is diffused and created by a high-temperature annealing. In addition, the N-type first semiconductor region 110 may be created as a retrograde well region.

In addition, the LDMOS device 300 further includes a gate electrode 180, which is formed between a source region 190 and a drain region 140 with high concentration, and partially above an insulation layer 170. The insulation layer 170 is relatively thick. The insulation layer 170, such as local oxide of silicon (LOCOS) insulation layer, is located between the gate electrode 180 and the drain region 140. The insulation layer 170 may take a role of a Reduced Surface Field (RESURF) to lower a high electric field of the drain region 140 in order that the high electric field does not apply to the gate insulating layer (not shown) under the gate electrode 170.

In addition, the LDMOS device 300 further includes a P-type buried doping layer 130, which is formed in the N-type first semiconductor region 110 to be separated from a bottom surface of the insulation layer 170. In one example, the P-type buried doping layer 130 exists under the insulation layer 170. The P-type buried doping layer 130 may be separated from or abutted to the LOCOS insulation layer. That is, the P-type buried layer 130 in the LDMOS device 300 does not have to be attached to a surface. According to another example of the present disclosure, there is another P-type buried doping layer, for example, a second P-type buried doping layer, which is separated from the P-type buried doping layer attached to the surface that is a first P-type buried doping layer 130. The P-type buried doping layer 130 may include a plurality of P-type buried layers which are separated from each other. There is an effect that the P-type buried doping layer 130 may enable a depletion zone to be easily formed in the N-type first semiconductor region 110 in a reverse-bias condition.

The second region 200 is formed in the P-type epitaxial layer 20. The second region 200 includes a N-type second semiconductor region 210, a P-type second body region 220, a P-type first highly doped region 250, a P-type second highly doped region 270, and a N-type third highly doped region 280. The P-type first highly doped region 250 and the P-type second highly doped region 270 are formed in the P-type second body region 220. On the other hand, N-type third highly doped region 280 is formed in the N-type second semiconductor region 210 and works as a path if a bias voltage is applied to the N-type second semiconductor region 210. Here, the P-type first highly doped region 250 is connected to the drain region 140 of the LDMOS device 300 using a metal interconnection 430. The P-type first highly doped region 250 and the P-type second highly doped region 270 both are formed in the P-type second body region 220.

A second insulation layer 260 is formed between the P-type first highly doped region 250 and the P-type second highly doped region 270. A third insulation layer 290 also is formed between the P-type second highly doped region 270 and the N-type third highly doped region 280. Another insulation layer 295 is needed to electrically separate the N-type third highly doped region 280 from its peripheral devices.

If a voltage that is greater than or equal to a threshold voltage is applied to the gate electrode 180 of the LDMOS device 300 and, thus, the LDMOS device 300 is turned on, an electric current is applied to the LDMOS device 300. As a result, an electric potential of the drain region 140 of the LDMOS device 300 becomes low. The drain region 140 of the LDMOS device 300 is electrically connected to the P-type first highly doped region 250 within the P-type second body region 220 using the metal interconnection 430. For this reason, if an electric potential of the drain region 140 becomes low, an electric potential of the P-type first highly doped region 250 in the second body region 220 becomes low, too. In the end, the P-type first highly doped region 250 and the P-type second highly doped region 270, which are in the same P-type second body region 220 may have different electric potentials. That is, a potential difference occurs between the P-type second highly doped region 270 of the P-type second body region 220 and the drain region 140 of the LDMOS device 300. Due to the potential difference, a first signal of low voltage turning on the LDMOS device 300 appears as a second signal whose potential level is changed in the second region 200. As described above, for the potential difference, the P-type first highly doped region 250 and the P-type second highly doped region 270 are separated from each other in the P-type second body region 220 by the second insulation layer 260, in the second region 200.

In addition to the P-type second body region 220, other devices such as a Low Voltage/High Voltage device, a capacitor, and a Bipolar Junction Transistor may be included in the second region 200.

A first interconnection region 400 is formed over an epitaxial layer 20 and includes the metal interconnection 430 that connects the first region 100 and the second region 200 electrically. The first interconnection region 400 with high breakdown voltage further includes a first insulation layer 420. The first insulation layer 420 may have a LOCOS oxide layer or a trench structure, and the LOCOS oxide layer may be thick. The first interconnection region 400 further includes a P-type junction isolation region 410 formed between the N-type first semiconductor region 110 and the N-type second semiconductor region 210, so the LDMOS device 300 is electrically separated from the second region 200. A P-type junction isolation region 410, whose concentration is higher than the concentration of the P-type epitaxial layer 20, is inserted. For example, if the doping concentration of the P-type epitaxial layer 20 is in the range of $1E13/cm^3$ to $1.5E14/cm^3$, the doping concentration of the P-type junction isolation region 410 is in the range of $1E15/cm^3$ to $1E17/cm^3$ to have a concentration over 2 orders of magnitude greater than the concentration of P-type epitaxial layer 20 or P-type substrate 10. The P-type junction isolation region 410 is able to more easily separate the N-type first semiconductor region 110 from the N-type second semiconductor region 210 to reduce the occurrence of leakage current. That is, the first interconnection region 400 prevents current from leaking from the LDMOS device 300 to the second region 200. In addition, there is an effect of reducing the distance between the N-type second semiconductor region 210 of the second region 200 and the N-type first semiconductor region 110 of the LDMOS device 300.

The metal interconnection 430 is formed on the first insulation layer 420 which has a LOCOS oxide layer. The metal interconnection 430 is used for transferring and receiving a signal between the drain region 140 of the LDMOS device 300 and the second region 200 in which operations occur under the condition of a high breakdown voltage (or high voltage). Here, the LOCOS oxide layer may be replaced with a trench layer instead of using the LOCOS layer. In FIG. 2, since all of a plurality of insulation layers 125, 170, 420, 260, 290, 295 are formed in the same stage at the same time, they are made of the same materials and have the same thickness. The structure of insulation layers 125, 170, 260, 290, 295, 420 may be a LOCOS or trench shape.

Figure 3A:
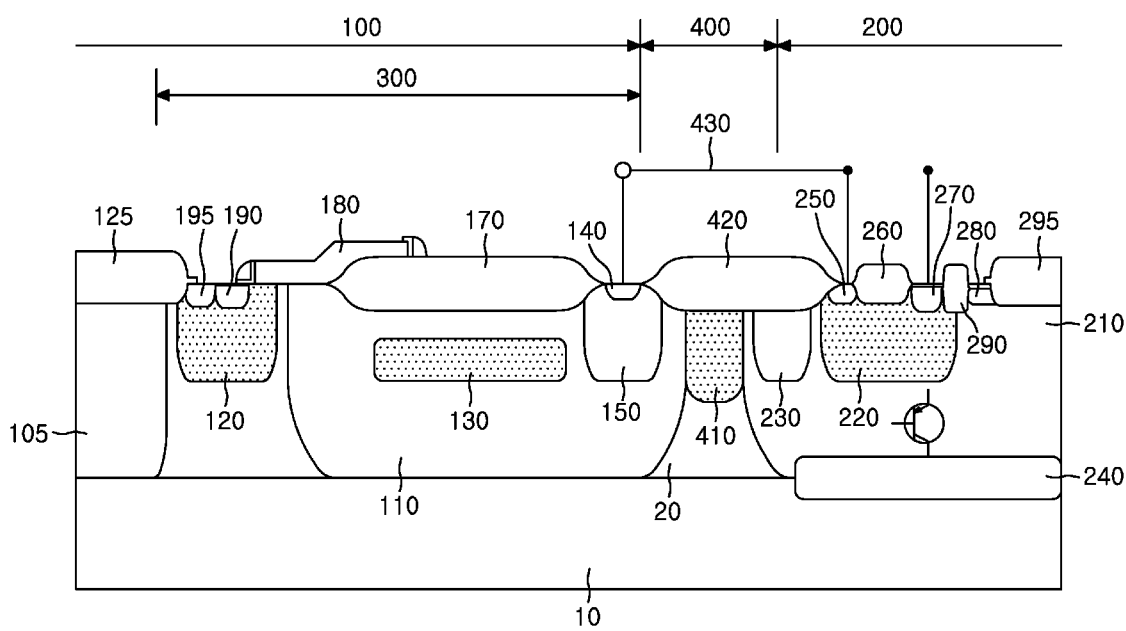
FIG. 3A and FIG. 3B are cross-sectional views of the high voltage semiconductor device illustrated in FIG. 2 with additional features according to an example.
Figure 3B:
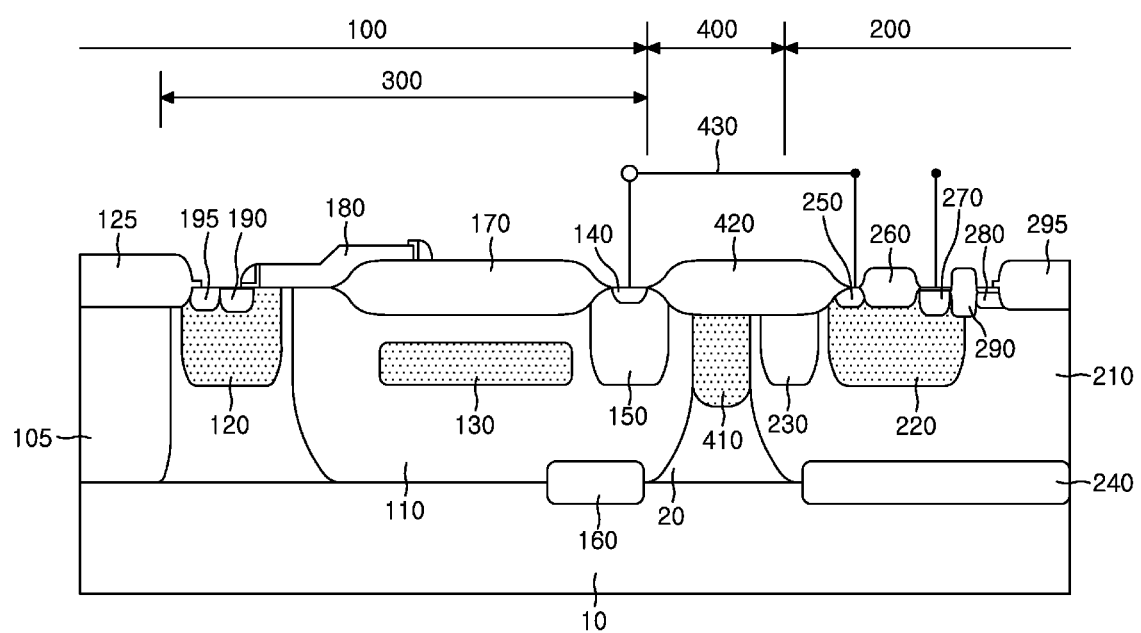

FIGS. 3A and 3B are cross-sectional views of an example of a high voltage semiconductor device that has additional features based on the high voltage semiconductor device illustrated in FIG. 2.

With FIGS. 3A and 3B, the additional features added to the high voltage semiconductor device of FIG. 2 are described.

As illustrated in FIG. 3A, in a high voltage semiconductor device according to an example of the present disclosure, the LDMOS device 300 further includes an N-type first well region 150 that is disposed under the drain region 140. The N-type first well region 150 prevents a horizontal parasitic transistor. In addition, the N-type first well region 150 has a structure that encompasses the drain region 140, and may be shaped as a guide ring. In the LDMOS device 300, the concentrations of an N-type first semiconductor region 110, a first well region 150, and a drain region 140 are ordered from lowest to highest. The resistance of the drain region 140 becomes the lowest overall and also the on-resistance ($R_{on}$).

The second region 200 further includes an N-type second well region 230 formed in the N-type second semiconductor region 210 and a second buried doping layer 240 formed between the N-type second semiconductor region 210 and the P-type substrate 10. Here, the N-type second well region 230 is formed under the first insulation layer 420 of the second region 200 in order to prevent a lateral leakage current. For example, operations of a parasitic transistor may occur in a lateral direction based on a substrate surface by the lateral P-type second body region 220, the N-type second semiconductor region 210, and the P-type junction isolation region 410. The N-type second well region 230 is created to prevent the parasitic transistor. Therefore, the lateral leakage current occurring as a parasitic transistor is prevented.

In addition, based on the surface of substrate, operations of the parasitic transistor may occur in a vertical direction. The operation of parasitic transistor in a vertical direction may occur in the direction from the P-type second body region 220 to the N-type second semiconductor region 210 and the P-type substrate 10. In order to prevent this, the second N-type buried doping layer 240 is formed between the N-type second semiconductor region 210 of the second region 200 and the P-type substrate 10. The second buried doping layer 240 with high concentration has a doping concentration in range of 1E18/cm3 to 1E20/cm3, which is much higher than that of the N-type second semiconductor region 210.

As illustrated in FIG. 3B, the LDMOS device 300 further includes a N-type first buried doping layer 160 which is formed between the N-type first semiconductor region 110 and the P-type substrate 10. The first buried doping layer 160 under the drain region 140 of the LDMOS device 300 is arranged to withstand a high breakage voltage of an isolation region. That is, the first buried doping layer 160 with high concentration prevents the generation of parasitic capacitance. The concentration of the high concentration first buried doping layer 160 has a doping concentration of 1E18 to 1E20/cm$^3$.

The high voltage semiconductor device according to an example of the present disclosure significantly improves productivity during mass production of the device. Semiconductor fabrication processes mostly use the P-type substrate 10 and, thus, the P-type epitaxial layer 20 is the most developed and used. If an N-type epitaxial layer is used, it may result in a delay in the fabrication process due to changing the equipment used.

In order to improve the above weakness, the high voltage semiconductor device, according to the example of the present disclosure, reduces the fabrication time by forming the first and second buried doping layers 160, 240 on the P-type substrate 10 and developing an epitaxial layer as a P-type layer. As a result, the high voltage semiconductor device electrically protects devices located in the second region 200, and the size of the entire circuit is also reduced. The present disclosure increases the ability to produce devices using the P-type epitaxial layer 20 instead of using an N-type epitaxial layer.

Another example of the present disclosure (not illustrated) is described.

In the first interconnection region 400, instead of forming the P-type junction isolation region 410, an epitaxial layer 20 is formed below the bottom surface of the first insulation layer 420. In this example, it is necessary to enlarge the distance between the N-type second semiconductor region 210 of the second region 200 and the N-type first semiconductor region 110 of the LDMOS device 300, which is in order to obtain a necessary depletion region. In this case, the second well region 230 in the N-type second semiconductor region 210 and the N-type first well region 150 in the N-type first semiconductor region 110 are not formed.

Figure 4:
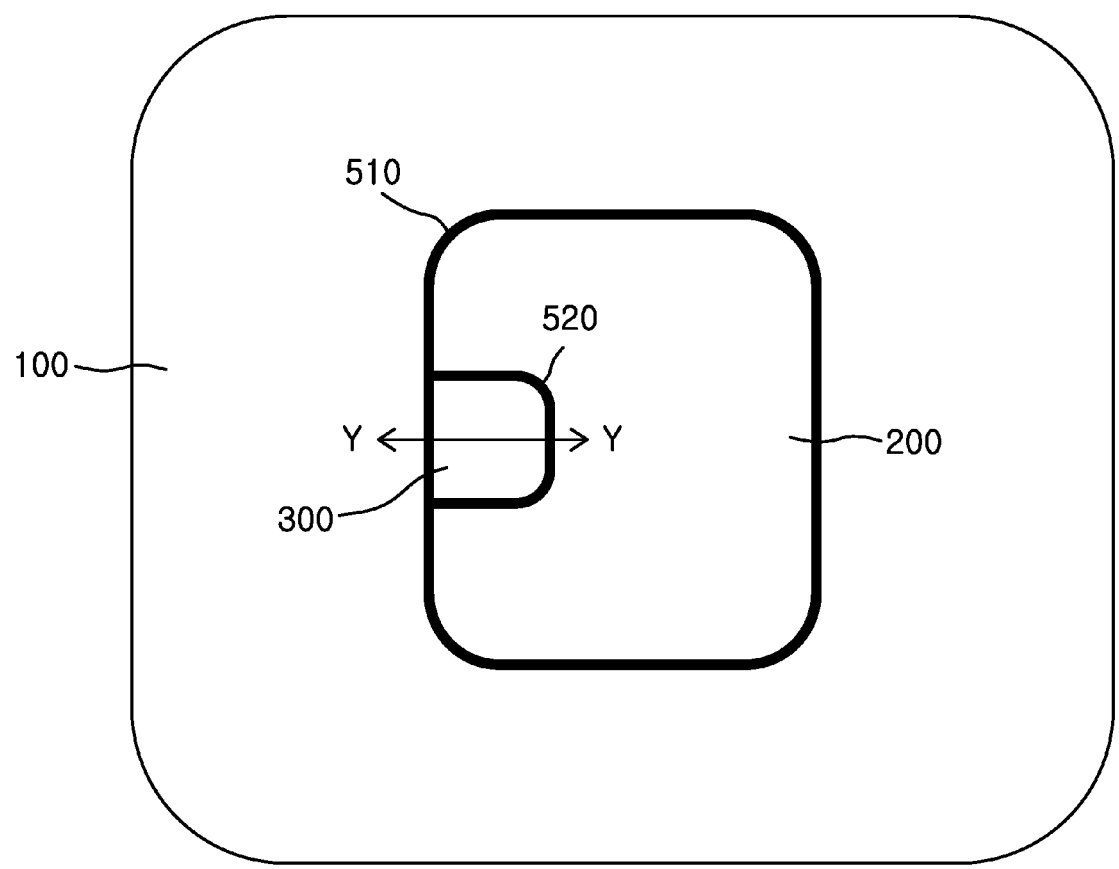
FIG. 4 is a top plan view of another example of a high voltage semiconductor device.

FIG. 4 is a top plan view of an example of another high voltage semiconductor device.

As illustrated in FIG. 4, the high voltage semiconductor device according to the example includes a first region 100, a second region 200, a Laterally Diffused Metal-Oxide Semiconductor (LDMOS) device 300, a first deep trench 510, and a second deep trench 520. Here, the LDMOS device 300 is surrounded by the first deep trench 510 and the second deep trench 520, and thus, separated from the first region 100 and the second region 200.

Hereinafter, FIGS. 5A and 5B, which are cross-sections made by cutting along the line between Y and Y in FIG. 4, are referred to describe detailed features of each component of the high voltage semiconductor device.

Figure 5A:
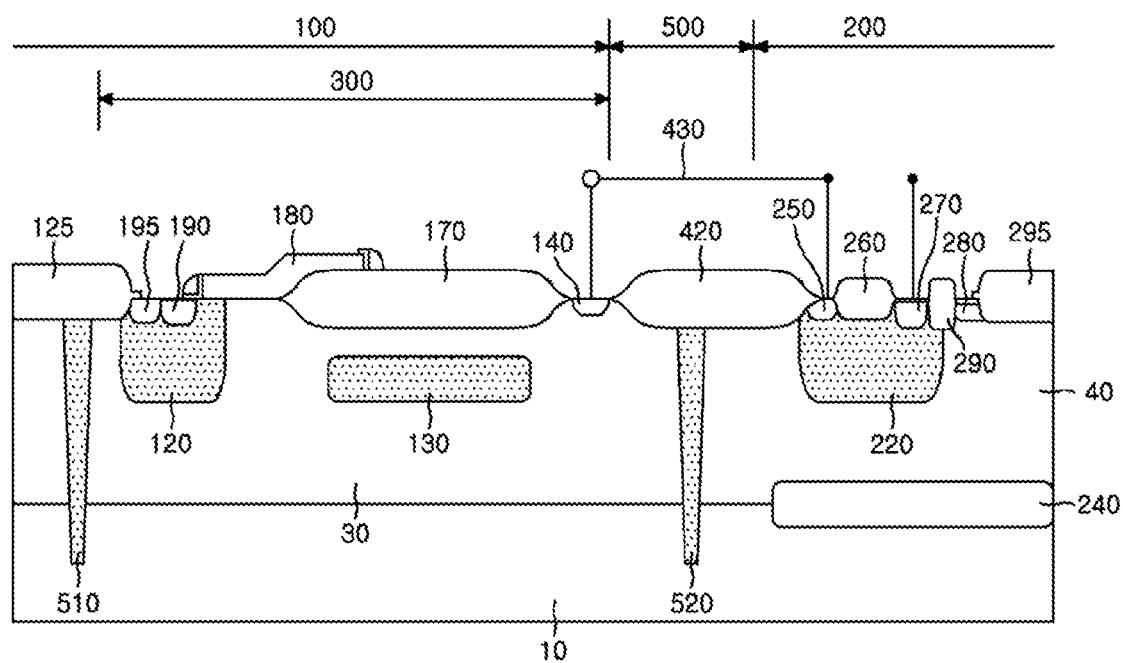
FIG. 5A and FIG. 5B are cross-sectional views of another example of a high voltage semiconductor device.
Figure 5B:
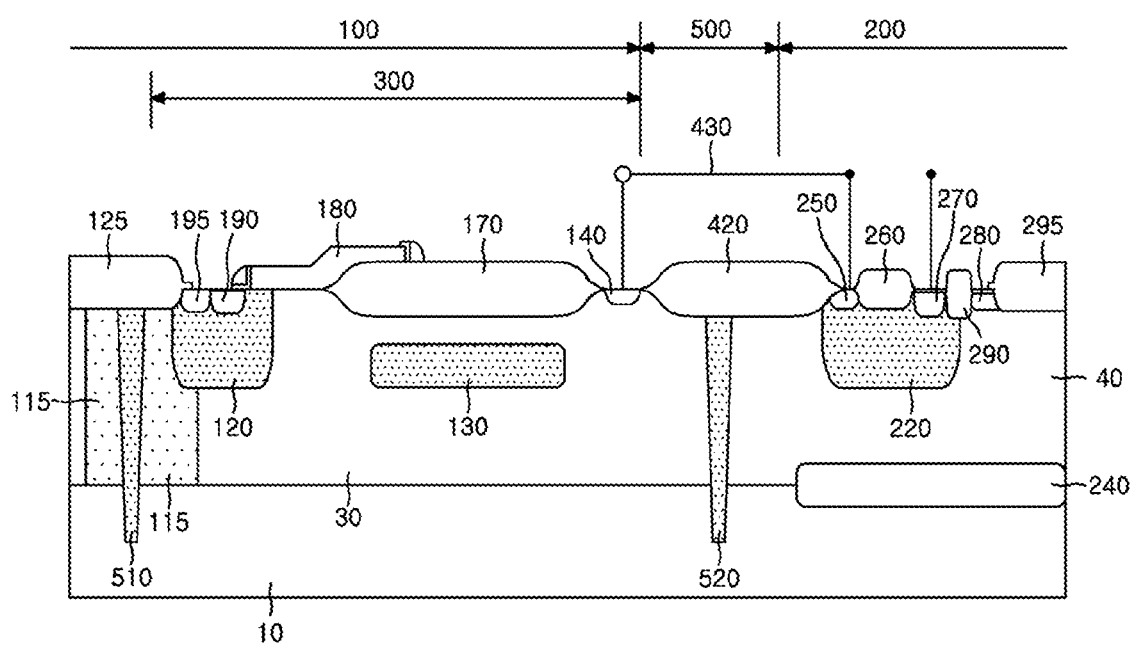

FIG. 5A and FIG. 5B are cross-sectional views of a high voltage semiconductor device according to another example.

As illustrated in FIGS. 5A and 5B, the high voltage semiconductor includes a first region 100, a second region 200, a Laterally Diffused Metal-Oxide Semiconductor (LDMOS) device 300 and a second interconnection region 500. FIGS. 5A and 5B illustrate the example of using an N-type first epitaxial layer 30 and an N-type second epitaxial layer 40 instead of a P-type epitaxial layer 20. The N-type first and second epitaxial layer 30, 40 are formed on a P-type substrate 10. The N-type first and second epitaxial layers 30, 40 may be simultaneously formed on the P-type substrate 10. The N-type first and second epitaxial layers 30, 40 may become an N-type semiconductor substrate.

The first region 100 is formed in the N-type first epitaxial layer 30 that is formed on the P-type substrate 10. The first region 100 includes the first deep trench 510. The first deep trench 510 electrically separates a transistor formed close to the LDMOS device 300 from the LDMOS device 300.

The LDMOS device 300 is formed in the N-type first epitaxial layer 30 and transfers a signal of the first region 100 to the second region 200. The LDMOS device 300 includes a source region 190 formed in a P-type first body region 120 and a drain region 140 formed in the N-type first epitaxial layer 30. In addition, the LDMOS device 300 further includes a gate electrode 180 formed between the source region 190 and the drain region 140, and partially on an insulation layer 170. In addition, the LDMOS device 300 further includes a P-type buried doping layer 130 that is separated from a bottom surface of the insulation layer 170 located in the N-type first epitaxial layer 30.

The second region 200 is formed in the N-type second epitaxial layer 40. The second region 200 includes a N-type second epitaxial layer 40, a second body region 220, a P-type first highly doped region 250 and a P-type second highly doped region 270, and a N-type third highly doped region 280. The P-type first highly doped region 250 and the P-type second highly doped region 270 are formed in the second body region 220. The second insulation layer 260 is formed between the P-type first highly doped region 250 and the P-type second highly doped region 270. A third insulation layer 290 is formed between the P-type second highly doped region 270 and the N-type third highly doped region 280. An insulation layer 295 may be further needed to electrically separate the N-type third highly doped region 280 from its peripheral devices.

A second interconnection region 500 is formed between the N-type first epitaxial layer 30 and the N-type second epitaxial layer 40, and electrically connects the first region 100 and the second region 200 using a metal interconnection 430. The second interconnection region 500 includes a second deep trench 520 formed between the N-type first epitaxial layer 30 and the N-type second epitaxial layer 40. The N-type epitaxial layer is divided into the N-type first epitaxial layer 30 and the N-type second epitaxial layer 40 by the second deep trench 520. The second deep trench 520 is included instead of the P-type junction isolation region 410 and reduces the width of the second interconnection region 500. Using the second deep trench 520 increases the breakdown voltage compared to using the P-type junction isolation region 410. The depth of the second deep trench 520 refers to the distance from the bottom surface of a LOCOS oxide layer to the P-type substrate 10.

Here, in order to increase the isolation function, the insides of first deep trench 510 and second deep trench 520 may be filled with a plurality of oxide layers. For the oxide layers, Low Pressure Chemical Vapor Deposition (LPCVD) oxide layer and other materials such as Phosphosilicate Glass (PSG), Borophosphosilicate Glass (BPSG) may be used. The LPCVD oxide layer or Tetraethyl Orthosilicate (TEOS) materials may be evaporated first, and then PSG or BPSG materials may be evaporated thereon. The PSG and BPSG materials may fill the insides of deep trenches by a Chemical Vapor Deposition (CVD) method, so the middle portions of the insides of respective deep trenches do not touch each other; thus, there is an air gap in the middle of plural deep trenches. In addition, the first and second deep trenches 510, 520 are created by the first process of evaporating an insulating layer and the second process of filling them with conductive materials such as polysilicon. The depths of first and second deep trenches 510, 520 may be 10 um to 30 um. The first and second deep trenches 510, 520 may be simultaneously formed in the same stage. The first and second deep trenches 510, 520 contact each other.

The high voltage semiconductor device further includes a P-type well region 115 encompassing the first deep trench 510. This structure may increase the breakdown voltage.

Figure 6:
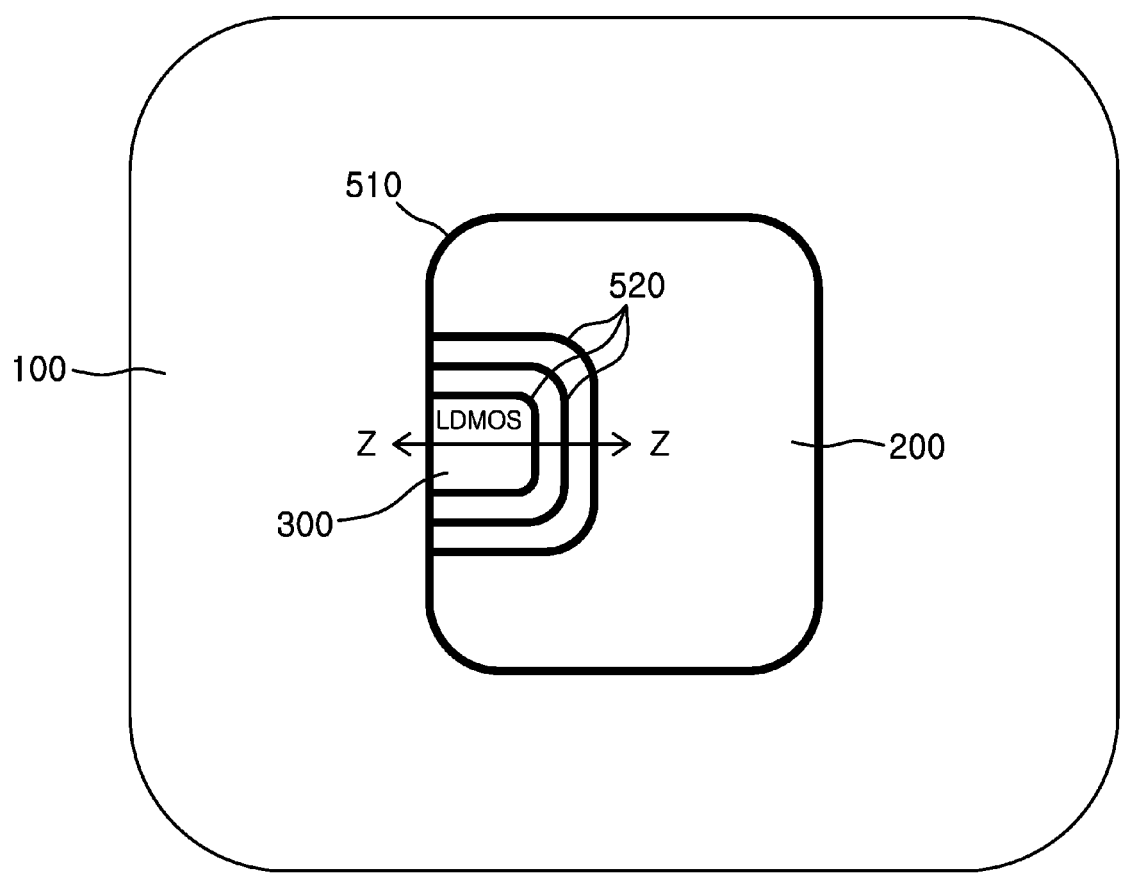
FIG. 6 is a top plan view of a high voltage semiconductor device according to another example.

FIG. 6 is a top plan view of another example of a high voltage semiconductor device.

As illustrated in FIG. 6, the high voltage semiconductor device according to another example includes a first region 100, a second region 200, a Laterally Diffused Metal-Oxide Semiconductor (LDMOS) device 300, and a first deep trench 510 and a plurality of second deep trenches 520. Here, the LDMOS device 300 is enclosed by the first deep trench 510 and a plurality of second deep trenches 520. For that reason, the first region 100 and the second region 200 are separated from each other. Contrary to FIG. 5, second deep trenches 520 of FIG. 6 are structured to include a plurality of trenches, which enhances the Isolation function.

Hereinafter, FIGS. 7A and 7B, which are cross-sectional views made by cutting along the line between Z and Z in FIG. 6, are referred to describe detailed features of each component of the high voltage semiconductor device.

Figure 7A:
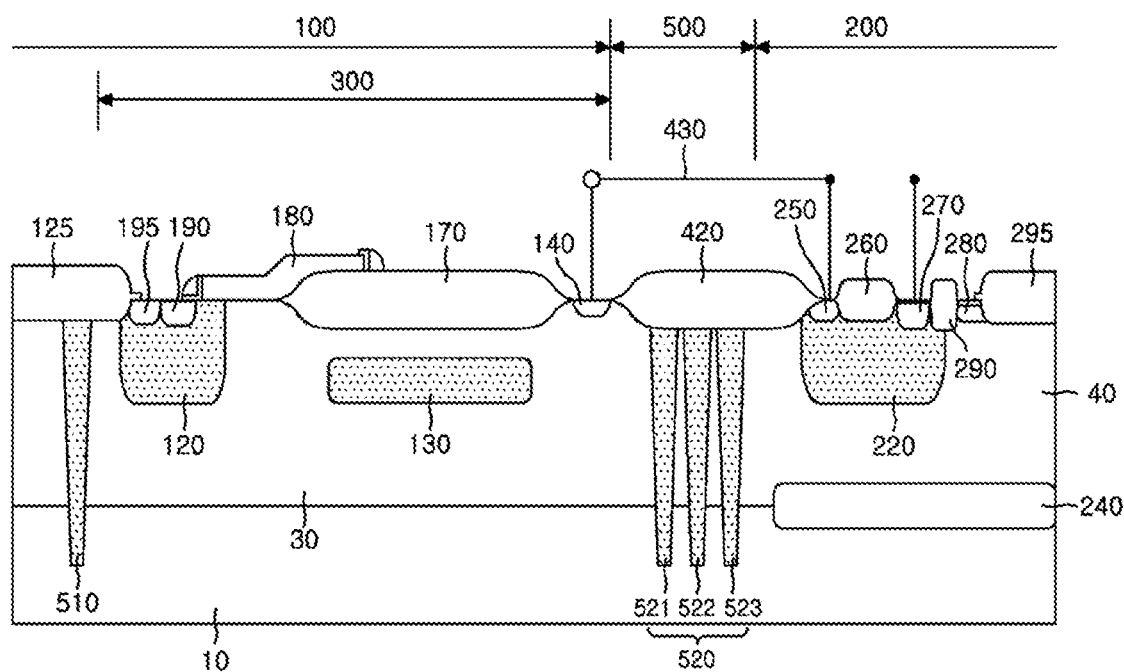
FIG. 7A and FIG. 7B are cross-sectional views of a high voltage semiconductor device according to another example.
Figure 7B:
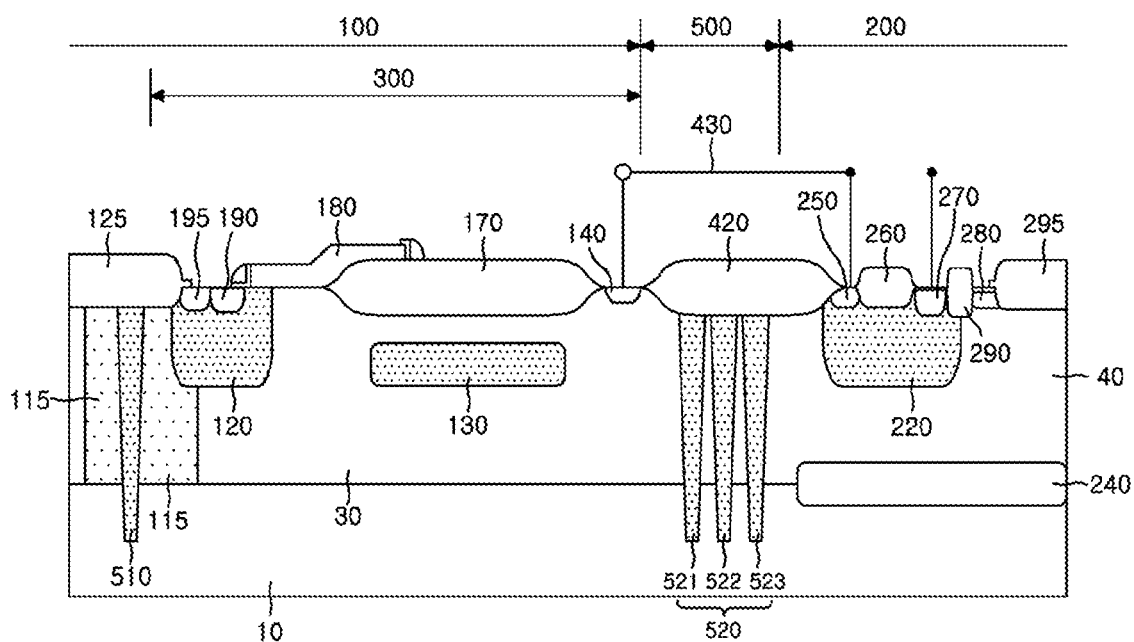

FIGS. 7A and 7B are cross-sectional views of another example of a high voltage semiconductor device according to another example.

As illustrated in FIGS. 7A and 7B, the high voltage semiconductor device includes a first region 100, a second region 200, a Laterally Diffused Metal-Oxide Semiconductor (LDMOS) device 300, and a second interconnection region 500.

The second interconnection region 500 is formed over a first epitaxial layer and a second epitaxial layer 30, 40, and electrically connects the first region 100 and the second region 200 using a metal interconnection 430. The second interconnection region 500 includes a second deep trench 520 formed between the LDMOS device 300 and the second region 200. The second deep trench 520 includes at least one or more than deep trenches 521 to 523. The greater the number of the second deep trenches 520 is, the higher a breakdown voltage increases. In this case, the second deep trench 520 may need at least two trenches. In short, between the LDMOS device 300 and the first region 100, a single deep trench is formed as illustrated in FIGS. 5A and 5B, or two or more deep trenches may be formed as illustrated in FIGS. 7A and 7B.

In addition, a P-type well region 115 formed near the first deep trench 510 is further included, which is helpful to increase a breakdown voltage.

As illustrated in FIGS. 5A, 5B, 7A and 7B, in an isolation region with high breakdown voltage, a first buried doping layer 160 may not be formed under a drain region 140 of the LDMOS device 300. However, a second buried doping region 240 formed under the second region 200 is needed to prevent a vertical parasitic transistor.

The second interconnection region 500 uses a deep trench so that a leakage current between the LDMOS device 300 and the second region 200 is completely blocked out. The high voltage semiconductor device according to the examples of the disclosure have a structure that is capable of controlling the isolation region with high breakdown voltage based on the depth, distance, and the number of deep trenches, not based on the depletion of junction and, thus, is able to extend to the higher breakdown voltage.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A high voltage semiconductor device, comprising:
    a P-type first body region and a N-type drift region formed in a semiconductor substrate;
    a gate electrode formed over the P-type first body region and the N-type drift region;
    an insulation layer formed over the N-type drift region and overlapped with the gate electrode;
    a first isolation layer formed spaced apart from the insulation layer;
    an N-type first well region formed in the N-type drift region, wherein the N-type first well region is in contact with both the insulation layer and the first isolation layer; and
    an N-type second well region formed spaced apart from the N-type first well region and being in contact with the first isolation layer,
    wherein a depth of the N-type second well region and a depth of the N-type first well region with respect to a top surface of the semiconductor substrate are substantially similar.

2. The high voltage semiconductor device of claim 1, further comprising:
    a P-type junction isolation region formed between the N-type first well region and the N-type second well region; and
    an N-type junction isolation region formed adjacent to the P-type first body region, wherein the N-type junction isolation region has a depth deeper than a depth of the P-type junction isolation region.

3. The high voltage semiconductor device of claim 2, wherein the P-type junction isolation region is disposed below the first isolation layer and having a depth deeper than a depth of the P-type first body region with respect to the top surface of the semiconductor substrate.

4. The high voltage semiconductor device of claim 1, further comprising:
    an N-type semiconductor region surrounding the N-type second well region, wherein a depth of the N-type semiconductor region and a depth of the N-type drift region are substantially similar.

5. The high voltage semiconductor device of claim 1, further comprising:
    an N-type first buried doping layer formed between the N-type drift region and the semiconductor substrate; and
    an N-type second buried doping layer formed below the N-type second well region.

6. The high voltage semiconductor device of claim 1, further comprising:
    an N-type source region formed in the P-type first body region; and
    an N-type drain region formed in the N-type first well region.

7. The high voltage semiconductor device of claim 6, further comprising:
    a P-type second body region formed adjacent to the N-type second well region; and
    a P-type first doped region and a P-type second doped region both formed in the P-type second body region.

8. The high voltage semiconductor device of claim 7, further comprising:
    a metal interconnection formed on the first isolation layer, wherein the metal interconnection electrically connects the N-type drain region to the P-type first doped region.

9. A high voltage semiconductor device, comprising:
    an N-type first buried doping layer and an N-type second buried doping layer formed in a semiconductor substrate;
    an N-type first semiconductor region and an N-type second semiconductor region formed over the N-type first buried doping layer and the N-type second buried doping layer, respectively;
    a metal interconnection electrically connecting the N-type first semiconductor region to the N-type second semiconductor region;
    an N-type first well region and an N-type second well region formed in the N-type first semiconductor region and the N-type second semiconductor region, respectively;
    a P-type first body region formed adjacent to the N-type first semiconductor region;
    a P-type second body region formed in the N-type second semiconductor region;
    an insulation layer formed over the N-type first semiconductor region; and
    a first isolation layer formed over the N-type second semiconductor region, wherein the first isolation layer is in contact with the N-type first semiconductor region, the N-type second semiconductor region, the N-type first well region and the N-type second well region; and
    a gate electrode formed overlapped with the insulation layer.

10. The high voltage semiconductor device of claim 9, further comprising:
    an N-type source region formed in the P-type first body region; and
    an N-type drain region formed in the N-type first well region.

11. The high voltage semiconductor device of claim 9, wherein a depth of the N-type first semiconductor region and a depth of the N-type second semiconductor region with respect to a top surface of the semiconductor substrate are substantially similar.

12. The high voltage semiconductor device of claim 9, wherein a depth of the N-type first well region and a depth of the N-type second well region with respect to a top surface of the semiconductor substrate are substantially similar.

13. The high voltage semiconductor device of claim 9, wherein a depth of the P-type first body region and a depth of the P-type second body region with respect to a top surface of the semiconductor substrate are substantially similar.

14. The high voltage semiconductor device of claim 9, further comprising:
    a P-type junction isolation region formed between the N-type first well region and the N-type second well region; and
    an N-type junction isolation region formed adjacent to the P-type first body region, wherein the N-type junction isolation region has a depth deeper than a depth of the P-type junction isolation region.

15. The high voltage semiconductor device of claim 9, wherein the N-type second well region is overlapped with the metal interconnection.

* * * * *